US009541589B2

(12) United States Patent
Han

(10) Patent No.: US 9,541,589 B2
(45) Date of Patent: Jan. 10, 2017

(54) CAPACITANCE MEASURING CIRCUIT OF A TOUCH SENSOR AND CAPACITIVE TOUCH PANEL HAVING THE CAPACITANCE MEASURING CIRCUIT

(71) Applicant: LEADING UI CO., LTD., Anyang-si, Gyeonggi-do (KR)

(72) Inventor: Sang Hyun Han, Anyang-si (KR)

(73) Assignee: LEADING UI CO., LTD., Anyang-Si, Gyeonggi-Do (KR)

( * ) Notice: Subject to any disclaimer, the term of this patent is extended or adjusted under 35 U.S.C. 154(b) by 300 days.

(21) Appl. No.: 14/383,185

(22) PCT Filed: Feb. 22, 2013

(86) PCT No.: PCT/KR2013/001425
§ 371 (c)(1),
(2) Date: Sep. 5, 2014

(87) PCT Pub. No.: WO2013/133554
PCT Pub. Date: Sep. 12, 2013

(65) Prior Publication Data
US 2015/0042363 A1 Feb. 12, 2015

(30) Foreign Application Priority Data

Mar. 6, 2012 (KR) .................. 10-2012-0022923

(51) Int. Cl.
*G01R 27/26* (2006.01)
*G01R 15/00* (2006.01)
(Continued)

(52) U.S. Cl.
CPC .......... *G01R 27/2605* (2013.01); *G01R 15/00* (2013.01); *G06F 3/044* (2013.01); *G06F 3/0416* (2013.01);
(Continued)

(58) Field of Classification Search
CPC ...... G06F 3/041; G06F 3/0416; G06F 3/0418;
G06F 3/044; G01R 27/26; G01R 27/2605;
G01R 15/00; H03K 17/955; H03K 17/96;
H03K 17/962; H03K 17/9622; H03K
17/9645; H03K 2217/960715
See application file for complete search history.

(56) References Cited

U.S. PATENT DOCUMENTS 8,159,462 B1 * 4/2012 Seguine ................ G06F 3/0416
345/173
8,866,499 B2 * 10/2014 Iriarte ................ G01R 27/2605
264/1.25
(Continued)

FOREIGN PATENT DOCUMENTS

JP      2009-239666 A     10/2009
KR   10-2009-0030114 A     3/2009
(Continued)

OTHER PUBLICATIONS

International Search Report mailed May 24, 2013 in International Application No. PCT/KR2013/001425, filed Feb. 22, 2013.

*Primary Examiner* — Minh N Tang
*Assistant Examiner* — David Frederiksen
(74) *Attorney, Agent, or Firm* — Hauptman Ham, LLP

(57) ABSTRACT

A capacitance measuring circuit of a touch sensor includes a voltage comparing part, a control part, a complex switch, a charging/discharging circuit part and a timer part. The voltage comparing part outputs a first comparing signal by comparing with a first reference voltage and a sensing voltage of a touch sensor and a second comparing signal by comparing with a second reference voltage and the sensing voltage, in response to a first control signal provided from an external device. The control part outputs a charging/discharging control signal based on the first and second comparing signals, in response to a second control signal pro-
(Continued)

vided from an external device. The complex switch is connected to each two terminals of the touch sensors, and is configured to set a path transmitting a sensing signal to the touch sensor and a path receiving a sensing signal sensing a capacitance variation amount of the touch sensor via the touch sensor.

16 Claims, 9 Drawing Sheets

(51) Int. Cl.
    *G06F 3/044*     (2006.01)
    *H01L 29/78*     (2006.01)
    *H03K 17/96*     (2006.01)
    *G06F 3/041*     (2006.01)

(52) U.S. Cl.
    CPC ........... *H01L 29/78* (2013.01); *H03K 17/9622* (2013.01); *H03K 17/9645* (2013.01); *H03K 2217/960715* (2013.01)

(56) References Cited

U.S. PATENT DOCUMENTS

| | | | |
|---|---|---|---|
| 2006/0006883 A1* | 1/2006 | Foote | G01D 5/24 324/678 |
| 2009/0108914 A1* | 4/2009 | Zhang | H03K 17/962 327/517 |
| 2010/0073323 A1* | 3/2010 | Geaghan | G06F 3/044 345/174 |
| 2010/0123670 A1 | 5/2010 | Philipp | |
| 2011/0157077 A1* | 6/2011 | Martin | G06F 3/0418 345/174 |
| 2011/0187389 A1* | 8/2011 | Han | H03K 17/955 324/679 |
| 2011/0279131 A1* | 11/2011 | Kim | G06F 3/044 324/679 |

FOREIGN PATENT DOCUMENTS

| | | |
|---|---|---|
| KR | 10-2011-0089423 A | 8/2011 |
| KR | 10-2011-0125604 A | 11/2011 |

* cited by examiner

CAPACITANCE MEASURING CIRCUIT OF A TOUCH SENSOR AND CAPACITIVE TOUCH PANEL HAVING THE CAPACITANCE MEASURING CIRCUIT

CROSS-REFERENCE TO RELATED APPLICATIONS

This application is a U.S. National Phase of International Application Number PCT/KR2013/001425, filed Feb. 22, 2013, and claims priority under 35 U.S.C. §119 to Korean Patent Application No. 10-2012-0022923, filed on Mar. 6, 2012 in the Korean Intellectual Property Office (KIPO), the contents of which are herein incorporated by reference in their entirety.

BACKGROUND OF THE INVENTION

Technical Field

Exemplary embodiments of the present invention relate to a capacitance measuring circuit of a touch sensor and a capacitive touch panel having the capacitance measuring circuit. More particularly, exemplary embodiments of the present invention relate to a capacitance measuring circuit of a touch sensor, which is adapted to a large sized touch screen device having a long length of a touch sensor, for measuring capacitance of the touch sensor more stably and a capacitive touch panel having the capacitance measuring circuit.

Discussion of the Related Art

As electronic engineering technology and information technology have repeatedly advanced, the importance of electronic devices in daily life including a work environment has been steadily increasing. In recent years, the types of electronic devices have diversified. In particular, in the field of portable electronic devices, such as mobile phones and Portable Multimedia Players (PMPs), a vast number of devices with new designs to which new functionalities have been added have been released almost every day.

As the types of electronic devices which people encounter in daily life have gradually diversified and the functionalities of electronic devices have become advanced and complicated, there has been an urgent need for a user interface which users can easily learn and which can be manipulated intuitively.

Touch screen devices have attracted attention as input devices capable of meeting such a need, and have already been widely applied to a variety of electronic devices. A touch screen device is a device that senses the location of a touch of a user on a display screen and performs overall control of the electronic device, including the control of the display screen, using information about the sensed location of the touch as input information.

Methods of sensing the location of a touch on a touch screen device may be divided into discrete location detection and continuous location detection.

Discrete location detection is also referred to as a so-called matrix method, and is a method of dividing a 2D flat surface on a panel into a plurality of sections and sensing the presence of a touch in each of the sections.

In contrast, continuous location detection is a method in which a touch detection area is not divided into a limited number of sections and the location of a touch on a 2D flat surface is sensed in the form of successive values.

A continuous location detection-based touch screen device usually employs a specific algorithm in order to calculate successive coordinates from values measured using a limited number of electrodes.

FIG. 1 is a schematic diagram explaining a conventional continuous location detection-based capacitive touch panel. As shown in FIG. 1, the continuous location detection-based capacitive touch panel determines the location of a contact by sensing a variation in voltage attributable to resistance Rf and capacitance Cf formed in an electrode 10 upon a touch.

The capacitive touch panel includes a detection unit 20 as means for sensing a variation in voltage. In the conventional capacitive touch panel, an input channel 21 for applying a reference signal generated by the detection unit 20 and a reception channel 22 for receiving the reference signal, the voltage of which has varied while passing through an electrode 10, are connected to the first side portion of the electrode via a single conducting wire.

This case is problematic in that the reference signal applied and the signal received after flowing through the electrode 10 use the single conducting wire, so that an error occurs in the measurement of a variation in voltage related to the received signal and thus it is not easy to accurately sense the location of a touch. Here, the error in the measurement of the variation in voltage is proportional to a resistance component which is formed as the length of the electrodes 10 increases.

Accordingly, the conventional capacitive touch panel has the problem of not being applied to large-sized touch screen devices in which the length of electrodes 10 is long.

SUMMARY

Exemplary embodiments of the present invention provide a capacitance measuring circuit of a touch sensor, which is adapted to a large sized touch screen having a long touch sensor, for measuring capacitance of the touch sensor more stably.

Exemplary embodiments of the present invention also provide a capacitive touch panel having the above-mentioned capacitance measuring circuit.

According to one aspect of the present invention, a capacitance measuring circuit of a touch sensor includes a voltage comparing part, a control part, a complex switch, a charging/discharging circuit part and a timer part. The voltage comparing part outputs a first comparing signal by comparing with a first reference voltage and a sensing voltage of a touch sensor and a second comparing signal by comparing with a second reference voltage and the sensing voltage, in response to a first control signal provided from an external device. The control part outputs a charging/discharging control signal based on the first and second comparing signals, in response to a second control signal provided from an external device. The complex switch is connected to each two terminals of the touch sensors, and is configured to set a path transmitting a sensing signal to the touch sensor and a path receiving a sensing signal sensing a capacitance variation amount of the touch sensor via the touch sensor, in response to a third control signal provided from an external device. The charging/discharging circuit part charges a touch sensor selected by the complex switch from the first reference voltage to the second reference voltage or discharges the touch sensor selected by the complex switch from the second reference voltage to the first reference voltage, in response to the charging/discharging control signal. The timer part receives a third control signal and a fourth control signal provided from an external device, respectively measures charging time and discharging time of the charging/discharging circuit part, respectively measures entire charging time and entire discharging time, and outputs a corresponding output signal.

According to another aspect of the present invention, a capacitive touch panel includes a plurality of touch sensors and a capacitance measuring circuit connected to two terminals of the touch sensors to sense a touch position by sensing a capacitance variation of the touch sensor. The capacitance measuring circuit includes a voltage comparing part, a control part, a complex switch, a charging/discharging circuit part and a timer part. The voltage comparing part outputs a first comparing signal by comparing with a first reference voltage and a sensing voltage of a touch sensor and a second comparing signal by comparing with a second reference voltage and the sensing voltage, in response to a first control signal provided from an external device. The control part outputs a charging/discharging control signal based on the first and second comparing signals, in response to a second control signal provided from an external device. The complex switch connected to each two terminals of the touch sensors, and configured to set a path transmitting a sensing signal to the touch sensor and a path receiving a sensing signal sensing a capacitance variation amount of the touch sensor via the touch sensor, in response to a third control signal provided from an external device. The charging/discharging circuit part charges a touch sensor selected by the complex switch from the first reference voltage to the second reference voltage or discharges the touch sensor selected by the complex switch from the second reference voltage to the first reference voltage, in response to the charging/discharging control signal. The timer part receives a third control signal and a fourth control signal provided from an external device, respectively measures charging time and discharging time of the charging/discharging circuit part, respectively measures entire charging time and entire discharging time, and outputs a corresponding output signal.

According to a capacitance measuring circuit of a touch sensor and a capacitive touch panel, it is also adapted to a large sized touch screen device having a long length of a touch sensor to measure capacitance of the touch sensor more stably. Moreover, a path of a sensing signal passing a touch sensor is varied from a first side of a touch sensor to a second side of the touch sensor or is varied from the second side of the touch sensor to the first side of the touch sensor, so that one capacitance measuring circuit may be shared. Thus, an error ratio of a measuring value may be reduced with respect to a case measuring capacitance through two capacitance measuring circuit connected to two end portions of a touch sensor.

BRIEF DESCRIPTION OF THE DRAWINGS

The above and other features and aspects of the present invention will become more apparent by describing in detailed exemplary embodiments thereof with reference to the accompanying drawings, in which:

FIG. 10A shows a path of a capacitance sensing signal passing from a left side of a touch sensor to a right side of the touch sensor, and FIG. 10B shows a path of a capacitance sensing signal passing from the right side of the touch sensor to a left side of the touch sensor.

DETAILED DESCRIPTION OF THE INVENTION

Figure 1:
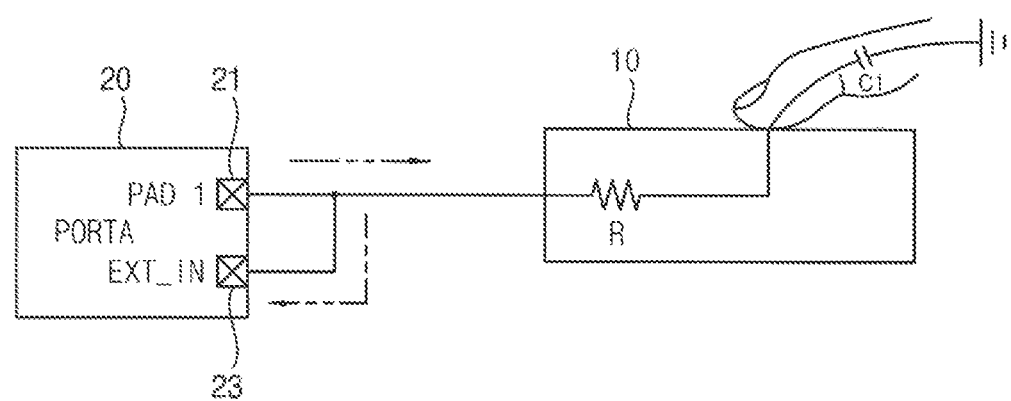
FIG. 1 is a schematic diagram explaining a conventional continuous location detection-based capacitive touch panel.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
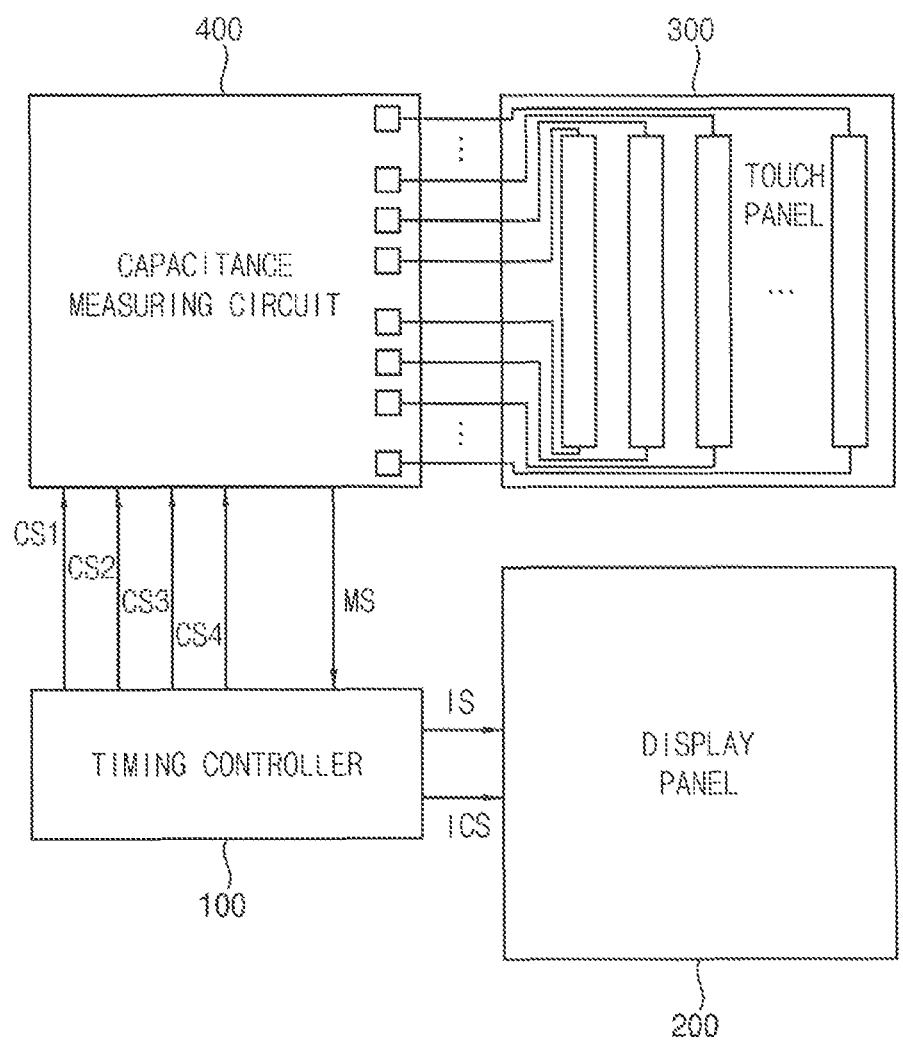
FIG. 2 is a block diagram explaining a capacitance type touch system according to an exemplary embodiment of the present invention.

FIG. 2 is a block diagram explaining a capacitance type touch system according to an exemplary embodiment of the present invention.

Referring to FIG. 2, the touch system according to the present invention includes a timing controller 100, a display panel 200, a touch panel 300 and a capacitance measuring circuit 400. The capacitance measuring circuit 400 may be mounted on the touch panel 300. When the capacitance measuring circuit 400 is mounted on the touch panel 300, the touch panel 300 may be defined as a capacitive touch panel.

The timing controller 100 provides the capacitance measuring circuit 400 with plural control signals CS1, CS2, CS3 and CS4, and receives a measuring signal MS corresponding to a measuring result provided from the capacitance measuring circuit 400 to calculate a touch coordinate.

The display panel 200 receives an image signal IS and an image control signal ICS for displaying the image signal IS which are provided from the timing controller 100 to display images. The display panel 200 may be disposed below the touch panel 300.

The touch panel 300 may be disposed on the display panel 200. A plurality of touch sensors is formed on the touch panel 300. The touch sensors may be formed in parallel with a horizontal direction. Alternatively, the touch sensors may be formed in parallel with a vertical direction. The touch sensor is formed by patterning a conductive material such as indium thin oxide (ITO) or carbon nano tube (CNT) having a uniform resistance per unique square. In the present exemplary embodiment, the touch sensor is formed in a single layer.

The capacitance measuring circuit 400 is connected to plural touch sensors formed on the touch panel 300. The capacitance measuring circuit 400 applies a constant current to each of the touch sensors to charge the touch sensors. The capacitance measuring circuit 400 measures capacitance of a corresponding touch sensor by measuring the time required for capacitance generated by the touch sensor and human body to discharge at a reference voltage, and provides the timing controller 100 with the measured capacitance.

Figure 3:
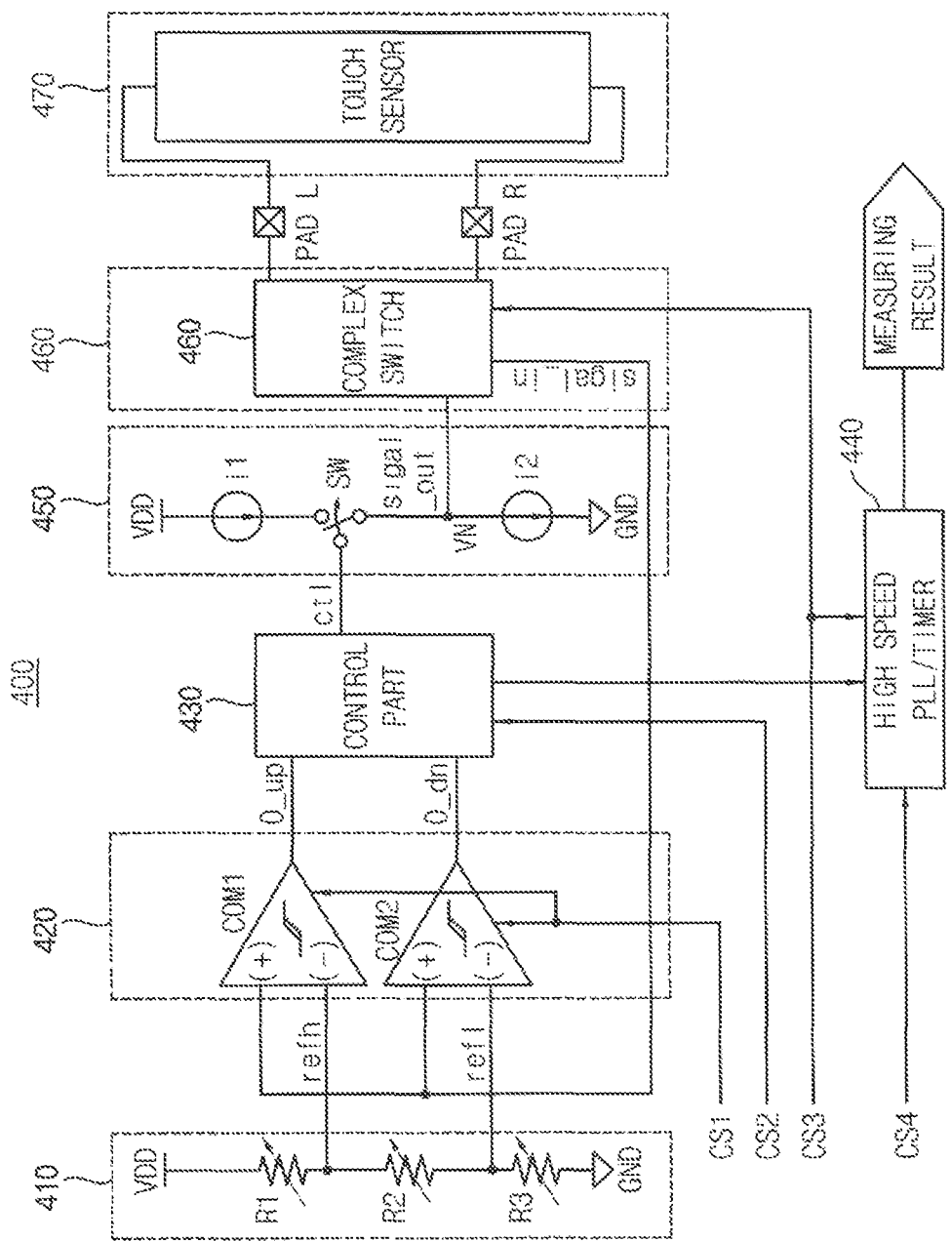
FIG. 3 is a block diagram explaining a capacitance measuring circuit shown in FIG. 2.
Figure 4:
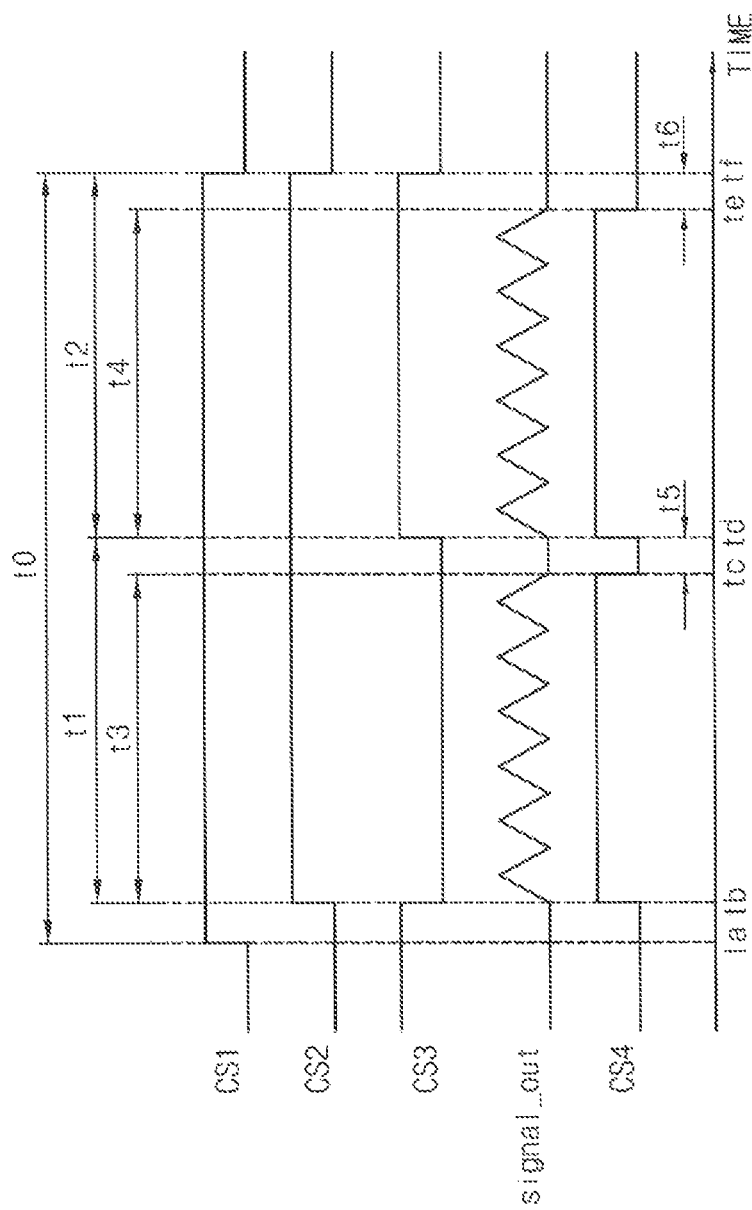
FIG. 4 is a block diagram explaining a capacitance measuring circuit shown in FIG. 3.

FIG. 3 is a block diagram explaining a capacitance measuring circuit shown in FIG. 2. FIG. 4 is a block diagram explaining a capacitance measuring circuit shown in FIG. 3.

Referring to FIGS. 3 and 4, a capacitance measuring circuit 400 of a touch sensor according to an exemplary embodiment of the present invention includes a reference voltage generating part 410, a voltage comparing part 420, a control part 430, a timer part 440, a charging/discharging part 450 and a complex switch 460. The capacitance measuring circuit 400 is connected to plural touch sensors to apply a constant current to the plural touch sensors. The capacitance measuring circuit 400 measures capacitance of a corresponding touch sensor by measuring entire discharging time required for discharging capacitance generated by the touch sensor and human body at a reference voltage.

Particularly, the charging/discharging circuit part 450 continuously performs charging and discharging in a predetermined period N times. When capacitance is input from a touch sensor connected to a complex switch 466, time difference is generated in the predetermined period. The timer part 440 measures an accumulated difference during N times to determine whether capacitance is input or not. As the charging/discharging times is increased, a time for the charging and discharging in creased when capacitance is measured through the touch sensor.

The reference voltage generating part 410 includes a first resistor R1, a second resistor R2 and a third resistor R3 which are serially connected to each other, and generates a first reference voltage 'refh' and a second reference voltage 'refl' to provide a voltage comparing part 20 with the first and second reference voltages 'refh' and 'refl'. In the present exemplary embodiment, each of the first to third resistors R1, R2 and R3 is a variable resistor. A resistance of the variable resistor may be varied by a program. Thus, the first reference voltage 'refh' and the second reference voltage 'refl' are variable voltages.

When a power noise applied to a capacitance measuring circuit is great or a noise provided from an external side is great, the first reference voltage 'refh' and the second reference voltage 'refl' are varied by using a program so that it may set a reference voltage which is not affected by noises.

In particular, as a size of a touch sense formed to sense capacitance is increased, a noise is more inflow due to an external environment so that a sensibility of capacitance is decreased. However, when the difference between a first reference voltage 'vrefh' and a second reference voltage 'vrefl' is controlled to have a small value, thereby more decreasing a noise characteristics.

When the difference between the first reference voltage 'refh' and the second reference voltage 'refl' is set to have a small value, a signal-to-noise (SNR) for the measured result is enhanced; however, a sensing signal for capacitance is reduced. Thus, proper voltage values for the first reference voltage 'refh' and the second reference voltage 'refl' are selected.

The voltage comparing part 420 compares with voltages generated in the reference voltage generating part 410 and a sensing voltage provided from the touch sensor in response to a first control signal provided from an external device (not shown). For example, the voltage comparing part 420 includes a first voltage comparator COM1 and a second voltage comparator COM2. In the present exemplary embodiment, the first control signal enables or disables the first and second voltage comparators COM1 and COM2. That is, a first control signal of H level enables the first and second voltage comparators COM1 and COM2, and a first signal of L level enables the first and second voltage comparators COM1 and COM2.

In response to a first control signal of H level, the first voltage comparator COM1 compares with a first reference voltage 'refh' generated in the reference voltage generating part 10 and a sensing voltage input from the touch sensor to output a first comparing signal O_up. The first comparing signal O_up is generated to have H level when a voltage of a signal compared in the first voltage comparator COM1 is greater than or equal to the first reference voltage 'refh', and is generated to have L level when the voltage of the signal compared in the first voltage comparator COM1 is smaller than the first reference voltage 'refh'. When the first comparing signal O_up of H level is output, a charging/discharging signal 'ctl' output from the control part 430 is controlled to be varied from H level to L level within a predetermined delay time of a normal operating time interval (e.g., an interval that a second control signal is H).

In response to the first control signal of H level, the second voltage comparator COM2 compares with a second reference voltage 'refl' generated in the reference voltage generating part 10 and a sensing voltage input from the touch sensor to output a second comparing signal O_dn. The second comparing signal O_dn is generated to have H level when a voltage of a signal compared in the second voltage comparator COM2 is smaller than or equal to the second reference voltage 'refl', and is generated to have L level when the voltage of the signal compared in the second voltage comparator COM2 is greater than the second reference voltage 'refl'. When the second comparing signal O_dn of H level is output, a charging/discharging signal 'ctl' output from the control part 430 is controlled to be varied from L level to H level within a predetermined delay time of a normal operating time interval (e.g., an interval that a second control signal is H).

In the present exemplary embodiment, each of the first and second voltage comparators COM1 and COM2 may include a voltage comparator with hysteresis. The voltage comparator with hysteresis is so called as a comparator having a Schmitt trigger. By using the voltage comparator with hysteresis, it may prevent a comparator from being sensitively operated when a noise of a power voltage applied to a capacitance measuring circuit or a noise of a ground voltage is applied thereto. When a semiconductor really developed based on a present application is operated in an application circuit, a signal-to-noise ratio (SNR) may be enhanced from a noise of a power voltage.

The control part 430 receives a first comparing signal O_up output from the first voltage comparator COM1, a second comparing signal O_dn output from the second voltage comparator COM2, and a second control signal provided from an external device, and controls an operation of the charging/discharging circuit part 450 and an operation of the timer part 440. For example, the control part 430 provides the charging/discharging circuit part 450 with a charging/discharging control signal 'ctl' in order to control an operation of the charging/discharging circuit part 450. The charging/discharging control signal 'ctl' is transitioned from an L level to a H level when the second control signal is transitioned from an L level to a H level, and the charging/discharging control signal 'ctl' is transitioned from a H level to an L level when the first comparing signal is transitioned from an L level to a H level. Moreover, the charging/discharging control signal 'ctl' is transitioned from an L level to a H level when the second comparing signal is transitioned from an L level to a H level, and the charging/discharging control signal 'ctl' is transitioned from a H level to an L level when the first comparing signal is transitioned from an L level to a H level. That is, after the charging/discharging control signal 'ctl' is transitioned to an H level by the second control signal, the charging/discharging control signal 'ctl' is transitioned to an L level by the first control signal, and then the charging/discharging control signal 'ctl' is transitioned to an H level by the second control signal.

The charging/discharging circuit part 450 is respectively connected to the control part 430 and the complex switch 460. In response to a charging/discharging control signal 'ctl', the charging/discharging circuit part 450 charges a sensing signal 'signal_in' input through the complex switch 460 from the first reference voltage 'refh' to the second reference voltage 'refl' or discharges the sensing signal 'signal_in' from the second reference voltage 'refl' to the first reference voltage 'refh'. In the present exemplary embodiment, a switch SW, which is turned-on/off in response to the charging/discharging control signal 'ctl', is connected between a node VN corresponding to the sensing signal and a ground terminal. That is, when the switch SW is turned-off, the charging/discharging circuit part 450 provides the node with a charging current 'i1' generated based on a power voltage of a power voltage terminal to charge a touch sensor. When the switch SW is turned-on, the charging/discharging circuit part 450 discharges a discharging current 'i2' corresponding to a touch sensor through the ground terminal.

The complex switch 460 switches input and output directions of a sensing signal in response to a third control signal provided from an external device. In the present exemplary embodiment, the third control signal may play a role of determining a signal delivering path of the complex switch 460. That is, the complex switch 460 may set a path of a capacitance sensing signal which is output from the charging/discharging circuit part 450. The complex switch 460 may set a path of the capacitance sensing signal, so that the capacitance sensing signal is passing from an upper portion (or left portion) of the touch sensor to a lower portion (or a right portion) of the touch sensor. Alternatively, the complex switch 460 may set a path of the capacitance sensing signal, so that the capacitance sensing signal is passing from a lower portion (or a right portion) of the touch sensor to an upper portion (or a left portion) of the touch sensor.

The timer part 440 measures charging time and discharging time of the charging/discharging circuit part 450 in response to a fourth control signal from an external device. Moreover, the timer part 440 measures entire charging time and entire discharging time, and outputs a measuring signal corresponding to the measured result. In the present exemplary embodiment, the fourth control signal controls an operation of the timer part 440. For example, in an interval that the fourth control signal is a first edge of H level, the timer part 440 is started to calculate the number of clocks corresponding to the predetermined period of a sensing signal 'signal'. In an edge interval of L level, which is generated after an edge interval of the first H level, an operation of the timer part 440 is stopped to maintain a value of the timer part 440, and the timer part 440 play a role of transmitting a measuring result.

In an interval that a second control signal is H level, the above operation is continuously repeated. A value of the timer part 440 is recognized as a capacitance value of each pad by the third control signal.

An initial starting starts in an output signal of a charging/discharging circuit part 450, that is, a ground level of a capacitance sensing signal. In this case, the output signal has a lower value lower than the first reference voltage 'vrefh' and a second reference voltage 'vrefl'. The second reference voltage 'vrefl' is a voltage higher than 0 V of a ground voltage 'GND'. For example, the second reference voltage 'vrefl' may be set as about 30 mV. The second reference voltage 'vrefh' may be set as about ½VDD to VDD-300 mV.

It will be described that a capacitance measuring circuit is operated in a normal status. When a voltage of the output signal is lower than vref, an output charging/discharging control signal 'ctl' of a control part 430 is 0V so that a comparator 420 and a control part 430 operate to have a straight shape of a rising slop in a triangle shape from a second reference voltage 'vrefh' to a first reference voltage 'vrefh'. Meanwhile, when a voltage of the output signal is reached at the first reference voltage 'vrefh', the switch SW is connected to an output terminal of the control part 430 so that the comparator 420 and the control part 430 operate to have a straight shape of a falling slop in a triangle shape.

The sensing signal 'signal' of the charging/discharging circuit part 450 play a role of operation of charging and discharging electric charges into a touch sensor connected to a pad based on a charging current 'i1' and a discharging current 'i2', waveform according to increasing or decreasing may be a straight line shape.

Figure 5:
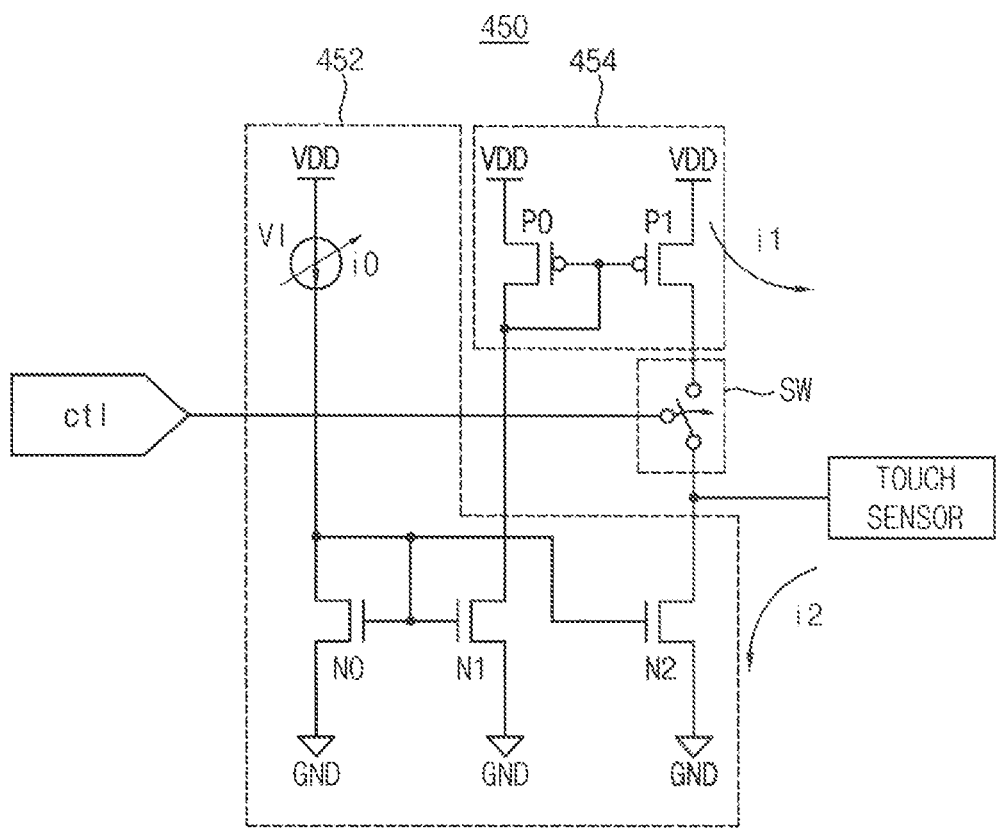
FIG. 5 is a circuit diagram explaining one example of a charging/discharging circuit part shown in FIG. 3.

FIG. 5 is a circuit diagram explaining one example of a charging/discharging circuit part 450 shown in FIG. 3.

Referring to FIG. 5, a charging/discharging circuit part 450 includes a charging part 452 outputting a charging current for charging a touch sensor, a discharging part 454 receiving a discharging current for discharging the touch sensor and a charging/discharging switch SW switching a connection between the charging part 452 and the touch sensor or a connection between the touch sensor and the discharging part 454.

The charging part 452 includes a first P-channel Metal-Oxide-Semiconductor Field-Effect Transistor (hereinafter, PMOS transistor) P0 and a second PMOS transistor P1. A source of the first NMOS transistor N0 and a source of the second NMOS transistor N1 are connected to a power voltage terminal providing a power voltage VDD, and gate and drain of the first NMOS transistor N0 are commonly connected to each other. Moreover, gates of the first and second NMOS transistors N0 and N1 are commonly connected to each other, so that a current mirror is configured. That is, the first NMOS transistor N0 and the second NMOS transistor N1 define a first current mirror. A drain of the second NMOS transistor N1 is connected to a touch sensor and the charging/discharging switch SW.

The discharging part 454 includes a variable constant current source VI, a first N-channel Metal-Oxide-Semiconductor Field-Effect Transistor (hereinafter, NMOS transistor) M0, a second NMOS transistor N1 and a third NMOS transistor N2. The first NMOS transistor N0, the second NMOS transistor N1 and the third NMOS transistor N2 may define a second current mirror.

The variable constant current source VI determines a current amount of a second current mirror. The variable constant current source VI may include a variable resistor determining a current amount of a bias of the first NMOS transistor N0. A current amount between a drain and source 'GND' of the first NMOS N0 is determined by a resistance value of the variable resistor.

In the first NMOS transistor N0, a source is connected to a variable constant current source VI, a drain is connected to a ground terminal, and a gate is connected to a gate of the second NMOS transistor N1.

In the second NMOS transistor N1, a source is connected to a drain of the first NMOS transistor N0, a gate is commonly connected to gate and source of the first NMOS transistor N0, and a drain is connected to a ground terminal GND.

In the third NMOS transistor N2, a source is connected to the charging/discharging switch SW, a gate is connected to a gate of the second NMOS transistor N1, and a drain is connected to a ground terminal GND. Source and gate of the first NMOS transistor N0 is commonly connected to each other and gate of the second NMOS transistor N1 is connected to the third NMOS transistor N2, so that it is configured to define a current-mirror. That is, the first NMOS transistor N0, the second NMOS transistor N2 and the third NMOS transistor N2 may define a second current mirror.

The charging/discharging switch SW includes a first terminal connected to the charging part 452, a second terminal connected to the discharging part 454 and the touch sensor and a control terminal receiving a charging/discharging control signal 'ctl' from an external device. The charging/discharging switch SW is tuned-on or turned-off by the charging/discharging control signal 'ctl'.

When the charging/discharging switch SW is turned-on, an electric path is formed between a charging part 452 and a touch sensor, so that a charging current output from the charging part 452 is provided to the touch sensor to charge the touch sensor.

When the charging/discharging switch SW is turned-off, an electric path is blocked between the charging part 452 and the touch sensor and an electric path between the touch sensor and a discharging part 454 is formed, so that a current charged in the touch sensor is provided to the discharging part 454 to discharge the touch sensor.

As described above, the first PMOS transistor P0 and the second NMOS transistor N1 are mirroring a current of the second PMOS transistor P1.

The second PMOS transistor P1 and the third NMOS transistor N2 are for charging or discharging capacitance to a touch sensor, may perform a function of providing current equal to a current of the first NMOS transistor N0 determined by the variable constant current source VI.

In the present exemplary embodiment, it is designed that a charging current 'i1' is not equal to a discharging current 'i2' and the discharging current 'i2' is greater than the charging current 'i1'. Moreover, in order to realize that a rising time of a triangle wave of a sensing signal is equal to a falling time of the triangle wave, it is designed that the discharging current 'i2' is twice of the charging current 'i1'.

In order to drive a signal line by using a current represented as 'i1*2=i2' in a current mirror, channel widths of NMOS transistors may be designed to satisfy the following Equation 1 and Equation 2.

$$N0=N1 \quad \text{[Equation 1]}$$

$$N2=N0*2 \quad \text{[Equation 2]}$$

Alternatively, a first PMOS transistor P0 and a second PMOS transistor P1 may be designed to have channel widths of an equal size. In this case, it is assumed that channel lengths of all Field-Effect Transistors (hereinafter, FET transistors) are equal to each other.

Thus, during an interval when a charging/discharging switch SW operated in response to a charging/discharging control signal 'ctl' is an "OFF" status, a voltage of a sensing signal is increased to have a slop of a straight type since it is charged by a charging current 'i1'.

Meanwhile, during an interval when the charging/discharging switch SW is an "ON" status, it is discharged by an electric current corresponding to i2−i1=i1 (here, i2−i1*2), that is, a discharging current 'i2'; however, a charging operation is also performed by a charging current 'i1' corresponding to a half of the charging current 'i2'. Thus, a final discharging current applied by a touch sensor signal 'signal' is discharged into a current amount of the charging current 'i1' so that a voltage of a signal is linearly decreased.

When a current equation of i2=i1*2 and an operation of a charging/discharging switch SW are used, an interval that a current is 0 is not generated any moment in a signal line sensing capacitance so that it is strong to an external noise to enhance a sensibility of capacitance.

In this exemplary embodiment, when each channel lengths of the first and second PMOS transistors P0 and P1 and the first to third NMOS transistors N0, N1 and N2, a channel width of the first PMOS transistor P0 and a channel width of the second PMOS transistor P1 are equal to each other, a channel width of the first NMOS transistor N0 and a channel width of the second NMOS transistor N1 are equal to each other, and a channel width of the third NMOS transistor N2 is twice of a channel width of the first NMOS transistor N0. Alternatively, it will be apparent to persons of ordinary skill in the art that channel lengths and channel widths of the FETs may be varied in order to perform a current mirroring operation.

For example, when each channel lengths of first and second PMOS transistors P0 and P1 and the first to third NMOS transistors N0, N1 and N2 is equal to each other, a ratio of a channel width of the first PMOS transistor P0 to a channel width of the second PMOS transistor P1 may be 1:N ('N' is a natural number), a ratio of a channel width of the first NMOS transistor N0 to a channel width of the second NMOS transistor N1 may be 1:N, and a ratio of a channel width of the first NMOS transistor N0 to a channel width of the third NMOS transistor N2 may be 1:N*M ('M' is 2*N).

For example, when N is 1 and M is 2, a channel width relationship between FETs is expressed as the following Equation 3.

$$P0:P1=1:1,$$

$$N0:N1:N3=1:1:2 \quad \text{[Equation 3]}$$

Meanwhile, when N is 4 and M is 2, a channel width relationship between FET transistors is expressed as the following Equation 4.

$$P0:P1=1:4,$$

$$N0:N1:N2=1:4:8 \quad \text{[Equation 4]}$$

Figure 6:
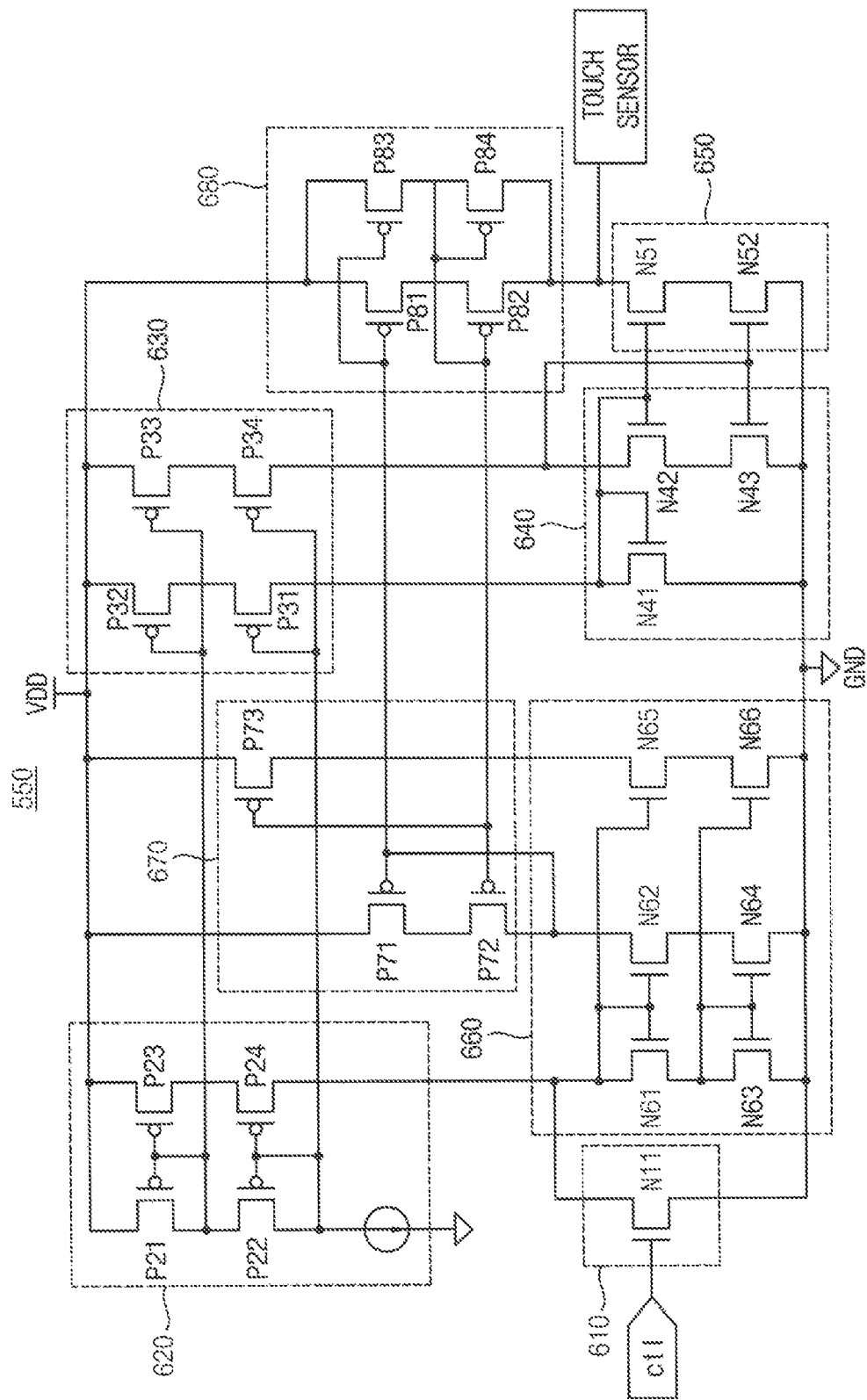
FIG. 6 is a circuit diagram explaining another example of a charging/discharging circuit part shown in FIG. 3.

FIG. 6 is a circuit diagram explaining another example of a charging/discharging circuit part 450 shown in FIG. 3.

Referring to FIG. 6, a charging/discharging part 450 includes a charging/discharging switch 610, a first current mirror 620, a second current mirror 630, a charging/discharging control part 640, a discharging part 650, a third current mirror 660, a charging control part 670 and a charging part 680.

The charging/discharging switch 610 is on or off in accordance with a charging/discharging control signal 'ctl' provided from an external device (not shown). The charging/discharging switch 610 includes NMOS transistor N11 turned-on or turned-off in accordance with the charging/discharging control signal 'ctl' received through a gate. NMOS transistor N11 is turned-on when the charging/discharging control signal 'ctl' of H level is received, and is turned-off when the charging/discharging control signal 'ctl' of L level is received.

The first current mirror 620 provides a first bias current corresponding to a power source voltage. The first current mirror 620 includes PMOS transistor P21, PMOS transistor P22, PMOS transistor P23 and PMOS transistor P24. In the present exemplary embodiment, PMOS transistor P21 and PMOS transistor P22 are serially connected to each other, and PMOS transistor P23 and PMOS transistor P24 are serially connected to each other. A gate of PMOS transistor P21 and a gate of PMOS transistor P23 are commonly connected to each other, and a gate of PMOS transistor P22 and a gate of PMOS transistor P24 are commonly connected to each other. A source of PMOS transistor P21 and a source of PMOS transistor P23 are commonly connected to a power voltage terminal to receive a power voltage VDD, and a drain of PMOS transistor P22 is connected to a ground terminal.

The second current mirror 630 is mirrored by the first bias current to output a second bias current. The second current mirror 630 includes a PMOS transistor P31, a PMOS transistor P32, a PMOS transistor P33 and a PMOS transistor P34. In the present exemplary embodiment, the PMOS transistor P31 and the PMOS transistor P32 are serially connected to each other, and the PMOS transistor P33 and the PMOS P34 are serially connected to each other. A source of the PMOS transistor P31 and a source of the PMOS transistor P33 are respectively connected to as power voltage terminal to receive a power voltage VDD. A gate of the PMOS transistor P31 and a gate of the PMOS transistor P33 are respectively connected to a gate and a source of the PMOS transistor P21 of the first current mirror 620. A gate of the PMOS transistor P32 and a gate of the PMOS transistor P34 are respectively connected to a gate and a source of the PMOS transistor P22 of the first current mirror 620.

The discharging control part 640 outputs a discharging control signal based on the second bias current. The discharging control part 640 includes an NMOS transistor N41, an NMOS transistor N42 and an NMOS transistor N43. In the present exemplary embodiment, a source and a gate of the NMOS transistor N41 are commonly connected to be connected to a drain of the PMOS transistor P32 of a second current mirror 630, and a drain of the NMOS transistor N41 is connected to a ground terminal. A source of the NMOS transistor N42 is connected to a drain of a PMOS transistor P34 of the second mirror 630, and a drain of the NMOS transistor N42 is connected to a source and a gate of the NMOS transistor N41. A source of the NMOS transistor N43 is connected to a drain of the NMOS transistor N42, a gate of the NMOS transistor N43 is connected to a drain of a PMOS transistor P34, and a drain of the NMOS transistor N43 is connected to a ground terminal.

The discharging part 650 is electrically connected to a touch sensor to discharge electric charges of the touch sensor in response to the discharging control signal. The discharging part 650 includes an NMOS transistor N51 and an NMOS transistor N52. In the present exemplary embodiment, the NMOS transistor N51 and the NMOS transistor N52 are serially connected to each other. A gate of the NMOS transistor N51 is connected to a gate of an NMOS transistor N42 of the discharging control part 640, and a gate of the NMOS transistor N52 is connected to a gate of an NMOS transistor N43 of the discharging control part 640. A source of the NMOS transistor N51 is connected to the touch sensor. A drain of the NMOS transistor N52 is connected to a ground terminal.

When the charging switch 610 is turned-off, the third current mirror 660 mirrors a current corresponding to the first bias current. The third current mirror 660 includes an NMOS transistor N61, an NMOS transistor N62, an NMOS transistor N63, an NMOS transistor N64, an NMOS transistor N65 and an NMOS transistor N66. In the present exemplary embodiment, the NMOS transistor N61 and the NMOS transistor N63 are serially connected to each other, the NMOS transistor N62 and the NMOS transistor N64 are serially connected to each other, and the NMOS transistor N65 and the NMOS transistor N66 are serially connected to each other. A source and a drain of the NMOS transistor N61 are commonly connected to each other to be connected to a drain of the PMOS transistor P24 of the first current mirror 620, a gate of the NMOS transistor N62 and a gate of the NMOS transistor N65. A source of the NMOS transistor N62 is connected to the charging control part 670. A source and a gate of the NMOS transistor N63 are commonly connected to each other to be connected to a drain of the NMOS transistor N61, a gate of the NMOS transistor N64 and a gate of the NMOS transistor N66. A drain of the NMOS transistor N63 is connected to a ground terminal, a drain of the NMOS transistor N64 is connected to a ground terminal and a drain of the NMOS transistor N66 is connected to a ground terminal.

The charging control part 670 outputs a charging control signal by mirroring of the third current mirror 660. The charging control part 670 includes a PMOS transistor P71, a PMOS transistor P72 and a PMOS transistor P73. In the present exemplary embodiment, the PMOS transistor P71 and the PMOS transistor P72 are serially connected to each other. A source of the PMOS transistor P71 is connected to a power voltage terminal to receive a power voltage, and a gate of the PMOS transistor P71 is commonly connected to a drain of the PMOS transistor P72 to be connected to the charging part 680. Moreover, a drain of the PMOS transistor P72 is connected to a source of a NMOS transistor N62 of a third current mirror 660. A source of the PMOS transistor P73 is connected to a power voltage terminal to receive a power voltage, and a gate of the PMOS transistor P73 is commonly connected to a gate of the PMOS transistor P72 to be connected to the charging part 680. A drain of the PMOS transistor P73 is connected to a source of an NMOS transistor N65 of the third current mirror 660.

The charging part 680 is electrically connected to the touch sensor to charge electric charges to the touch sensor in response to the charging control signal. The charging part 680 includes a PMOS transistor P81, a PMOS transistor P82, a PMOS transistor P83 and a PMOS transistor P84. In the present exemplary embodiment, the PMOS transistor P81 and the PMOS transistor P82 are serially connected to each other, and the PMOS transistor P83 and the PMOS transistor P84 are serially connected to each other. A source of the PMOS transistor P81 is commonly connected to a source of the PMOS transistor P83 to be connected to a power voltage terminal to receive a power voltage VDD. A gate of the PMOS transistor P81 and a gate of the PMOS transistor P83 are commonly connected to be connected to a gate of a PMOS transistor P71 and a drain of a PMOS transistor P72 of the charging control part 670. A gate of the PMOS transistor P82 and a source of the PMOS transistor P84 are commonly connected to be connected to a gate of a PMOS transistor P72 of the charging control part 670. A drain of the PMOS transistor P82 and a drain of the PMOS transistor P84 are commonly connected to be connected to the touch sensor and a source of an NMOS transistor N51 of the discharging part 650.

Hereinafter, an operation of the charging/discharging circuit part 450 shown in FIG. 6 will be briefly described.

When a charging/discharging control signal 'ctl' of L level is provided to the charging/discharging switch 610, the charging/discharging switch 610 configured by NMOS transistors is turned-off. The second current mirror 630 is activated by a first mirroring current output from the first current mirror 620, so that the second current mirror 630 provides the discharging control part 640 with a second mirror current. The second discharging control part 640 activates the discharging part 650 based on the second mirroring current. The discharging part 650 activated by discharging control part 640 discharges electrical charges charged at a touch sensor through a ground terminal. In this case, a first current mirror output from the first current mirror 620 is provided to the third current mirror to play a role of a bias current.

When a charging/discharging control signal 'ctl' of H level is provided to the charging/discharging switch 610, the charging/discharging switch 610 configured by NMOS transistors is turned-on. When the charging/discharging switch 610 is turned-on, a first mirror current output from the first current mirror 620 is also provided to the charging/discharging switch 610 so that the third current mirror 660 mirrors a low current having relatively level. Since the third current mirror 660 mirrors a current having a relatively low level, the charging control part 670 configured by PMOS transistors is activated to activate the charging part 680. When the charging part 680 is activated, the charging part 680 provides a touch sensor with electrical charges to charge the touch sensor. In this case, a voltage charged by the charging part 680 is greater than a voltage of the touch sensor discharged by the discharging part 650. Thus, electrical charges charged at the touch sensor are discharged when the charging part 680 is inactivated; however, a current corresponding to a power voltage VDD is provided to the touch sensor to charge the touch sensor when the charging part 680 is activated.

Figure 7:
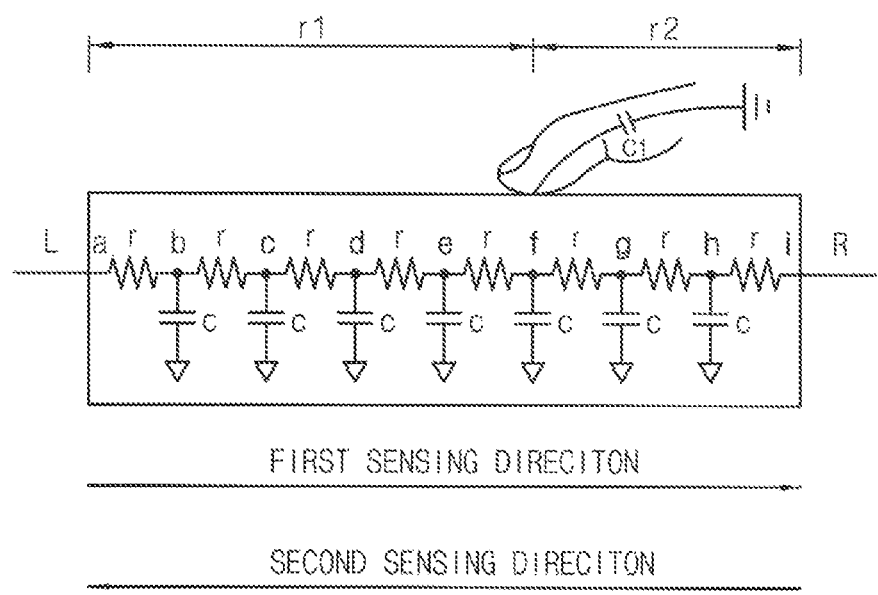
FIG. 7 is a schematic diagram schematically explaining capacitance sensing through a capacitive touch panel shown in FIG. 2.

FIG. 7 is a schematic diagram schematically explaining a capacitance sensing through a capacitive touch panel shown in FIG. 2.

Referring to FIG. 7, a plurality of touch sensors is disposed on a capacitive touch panel. The touch sensor is formed by patterning a conductive material such as indium thin oxide (ITO) or carbon nano tube (CNT) having a uniform resistance per unique square. In the present exemplary embodiment, the touch sensor is formed in a single layer.

The touch sensor has a uniform resistance component 'r' along a left and right direction, and has a minute parasitic capacitance 'c' in air or a virtual ground.

It is assumed that a touch for a human body is generated at 'f' position. In case of applying a sensing signal along a left and right direction (that is, a first sensing direction), a signal delay effect of $5*(r//c)+Cf$ is generated. In case of applying a sensing signal along a right and left direction (that is, a second sensing direction), a signal delay effect of $3*(r//c)+Cf$ is generated.

A physical position on a touch sensor where a touch is generated may be calculated by using the difference of delay time.

In order to generalize the above, when touch 'Cf' by a finger of the human body are generated in each positions of a, b, c, d, e, f, g, h and i, a delay phenomenon for sensing signals of a first sensing direction and a second sensing direction will be expressed as the following FIG. 5.

Figure 8:
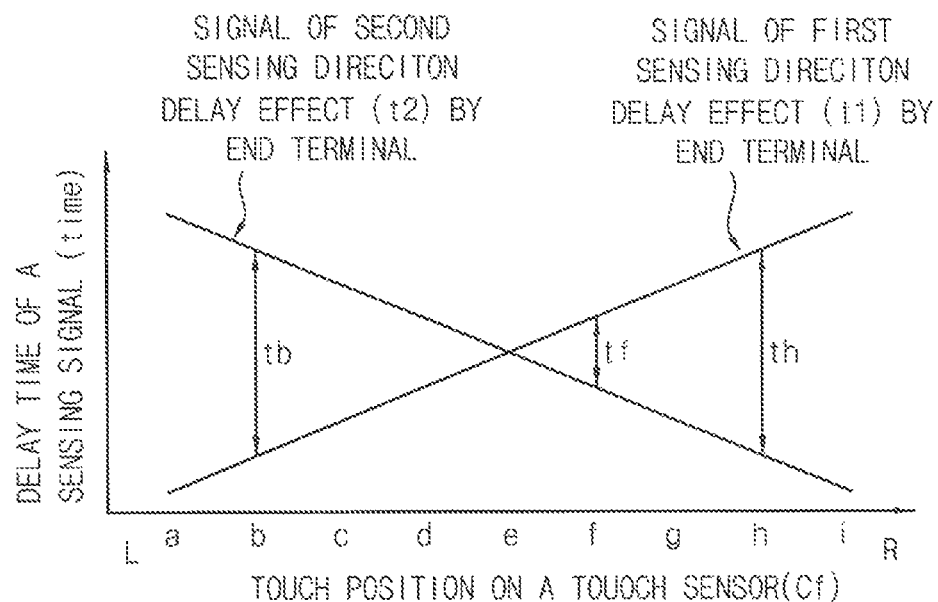
FIG. 8 is a graph schematically explaining a delaying of a sensing signal along a first sensing direction and a second sensing direction shown in FIG. 7.

FIG. 8 is a graph schematically explaining a delaying of a sensing signal along a first sensing direction and a second sensing direction shown in FIG. 7.

Referring to FIG. 8, as a touch position is progressing from 'a' to 'i', a delay time of a sensing signal is increased in a first sensing direction. As a touch position is progressing from 'i' to 'a', a delay time of a sensing signal is decreased in a second sensing direction.

The difference between a delay time measured in the first sensing direction and a delay time measured in the second sensing direction corresponds to a physical position on each touch sensors.

Time delay effects according to each of the first and second sensing directions of FIG. 6 are not shown in a straight line having a uniform slop such as shown in FIG. 6. However, its shapes are similar in form to a straight line shape, so that it expressed in a straight line.

Figure 9:
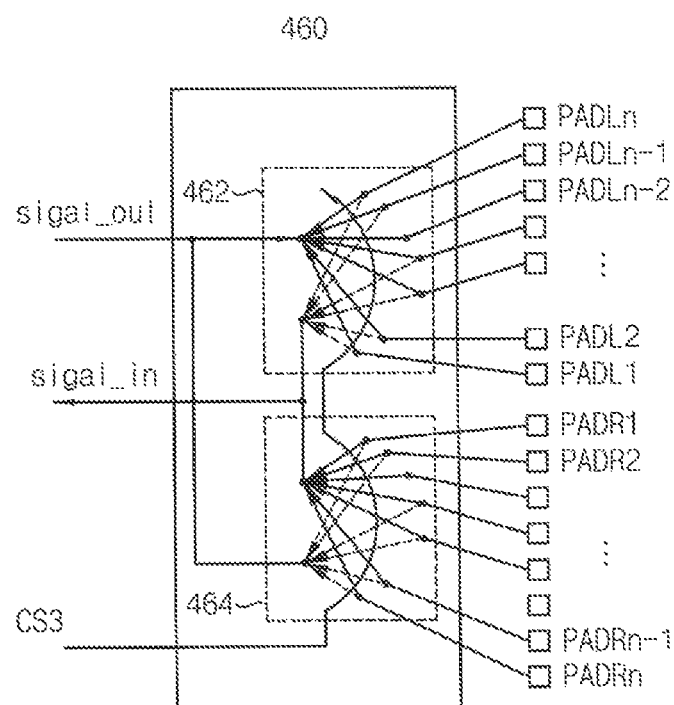
FIG. 9 is a schematic diagram explaining a complex switch shown in FIG. 3.

FIG. 9 is a schematic diagram explaining a complex switch shown in FIG. 3.

Referring to FIGS. 3 and 9, a complex switch 460 includes a first switch 462 and a second switch 464.

The first switch 462 is connected to the charging/discharging circuit part 450, each first terminal of the touch sensors, and the voltage comparing part 420 to switch a sensing signal passing the touch sensor to a first path in response to the third control signal provided from an external device.

The second switch 464 is connected to the charging/discharging circuit part 450, each second terminal of the touch sensors, and the voltage comparing part 420 to switch a sensing signal passing the touch sensor to a second path in response to the third control signal provided from an external device.

When the third control signal has a first level, the first switch 462 connects to the charging circuit part 450 and the first terminal of the touch sensor and the second switch 464 connects to the second terminal of the touch sensor and the voltage comparing part 420.

When the third control signal has a second level, the second switch 464 connects to the charging circuit part 450 and the second terminal of the touch sensor and the first switch 462 connects to the first terminal of the touch sensor and the voltage comparing part 420.

Figure 10A:
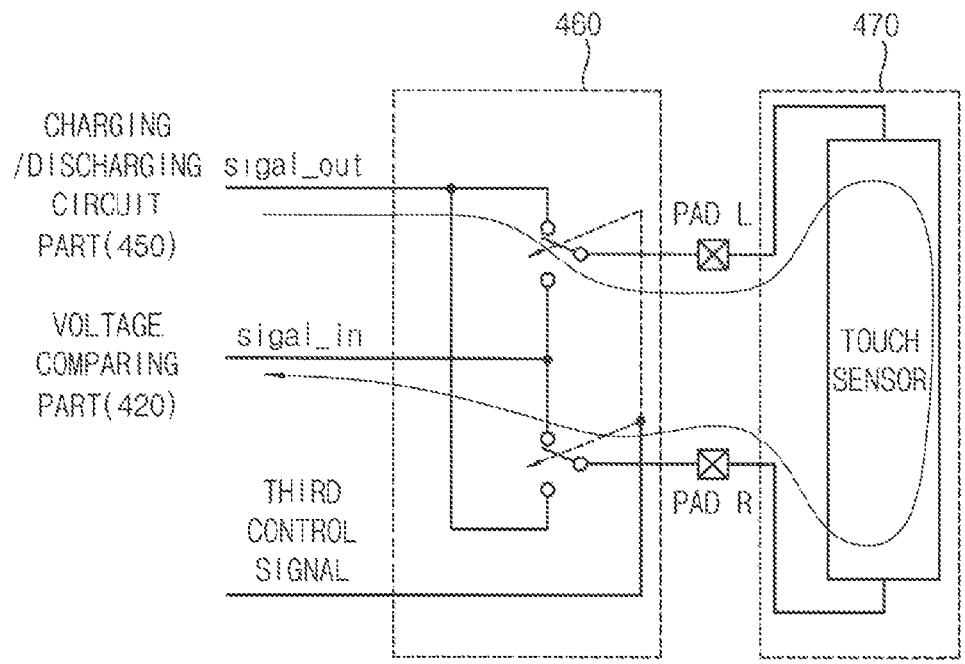
FIGS. 10A and 10B are schematic diagrams explaining a path of a capacitance sensing signal. Particularly.
Figure 10B:
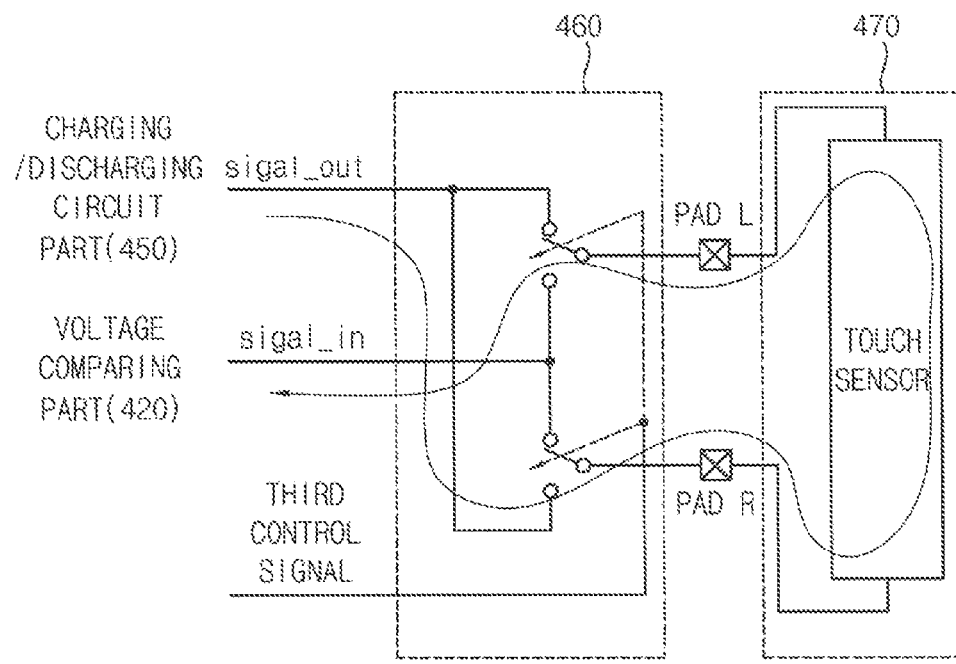

FIGS. 10A and 10B are schematic diagrams explaining a path of a capacitance sensing signal. Particularly, FIG. 10A shows a path of a capacitance sensing signal passing from a left side of a touch sensor to a right side of the touch sensor, and FIG. 10B shows a path of a capacitance sensing signal passing from the right side of the touch sensor to a left side of the touch sensor.

Referring to FIG. 10A, a sensing signal is transmitted from a left side of a touch sensor to a right side of the touch sensor and the transmitted signal is output through the right side of the touch sensor, so that a variation amount of capacitance is sensed.

When the third control signal is 0, a sensing signal 'signal_out' output from a charging/discharging circuit part 450 is applied to an upper side of a touch sensor through SW0 and PAD L, and a signal passing the touch sensor is applied to a voltage comparing part 420 through PAD R and SW1 via a lower side of the touch sensor. In this case, a first sensing path may be defined.

Referring to FIG. 10B, a sensing signal is transmitted from a right side of a touch sensor to a left side of the touch sensor and the transmitted signal is output through the left side of the touch sensor, so that a variation amount of capacitance is sensed.

When the third control signal is 1, a sensing signal 'signal_out' output from a charging/discharging circuit part 450 is applied to a lower side of the touch sensor through SW1 and PAD R, and a signal passing the touch sensor is applied to a voltage comparing part 420 through PAD L and SW0 via an upper side of the touch sensor. In this case, a second sensing path may be defined.

In a conventional art, capacitance measuring circuits are respectively connected to two end portions of a touch sensor. That is, since two capacitance measuring circuits are used therein, a silicon size within a semiconductor IC is dissipated. Moreover, a measuring value is not convergent to a uniform value due to a deviation between two circuits.

However, according to the present invention, since a flowing of a first sensing path and a flowing of a second sensing path are opposite to each other, a sensing path is controlled through a complex switch 460 by using one capacitance measuring circuit to obtain the measuring value so that an error ratio due to a deviation of internal circuits of a semiconductor may be decreased.

As described above, according to the present invention, it is also adapted to a large sized touch screen device having a long length of a touch sensor to measure capacitance of the touch sensor more stably. Moreover, a path of a sensing signal passing a touch sensor is varied from a first side of a touch sensor to a second side of the touch sensor or varied from the second side of the touch sensor to the first side of the touch sensor, so that one capacitance measuring circuit may be shared. Thus, an error ratio of a measuring value may be reduced with respect to a case measuring capacitance through two capacitance measuring circuit connected to two end portions of a touch sensor.

Moreover, a capacitive touch panel according to the present invention may be mounted on various products such as a sensing device sensing a touch position to be applicable. Touch screen type products are widely used in various fields of industry and are rapidly replacing button type devices due to their superior spatial characteristics. The most explosive demand is in the field of cell phones. In particular, in cell phones, convenience and the size of a terminal are very significant and thus, touch phones that do not include additional keys or minimize the number of keys have recently come into the spotlight. Thus, a sensing device having a capacitance type touch pattern according to the present invention mounted thereon may be employed in a cell phone and can also be widely used in a television ("TV") including a touch screen, an asynchronous transfer mode ("ATM") device that automatically serves cash withdrawal and remittance of a bank, an elevator, a ticket machine used in a subway, a portable multimedia player ("PMP"), an e-book, a navigation device, and the like. Besides, the touch display device replaces a general button type interface in all fields that require a user interface.

Having described exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A capacitance measuring circuit of a touch sensor, comprising:
   a voltage comparing part outputting a first comparing signal by comparing with a first reference voltage and a sensing voltage of a touch sensor and a second comparing signal by comparing with a second reference voltage and the sensing voltage, in response to a first control signal provided from an external device;
   a control part outputting a charging/discharging control signal based on the first and second comparing signals, in response to a second control signal provided from an external device;
   a complex switch connected to each two terminals of the touch sensors, and configured to set a path transmitting a sensing signal to the touch sensor and a path receiving a sensing signal sensing a capacitance variation amount of the touch sensor via the touch sensor, in response to a third control signal provided from an external device;
   a charging/discharging circuit part charging a touch sensor selected by the complex switch from the first reference voltage to the second reference voltage or discharging the touch sensor selected by the complex switch from the second reference voltage to the first reference voltage, in response to the charging/discharging control signal; and
   a timer part receiving a third control signal and a fourth control signal provided from an external device, respectively measuring charging time and discharging time of the charging/discharging circuit part, respectively measuring entire charging time and entire discharging time, and outputting a corresponding output signal.

2. The capacitance measuring circuit of claim 1, wherein the complex switch comprises:
   a first switch connected to the charging/discharging circuit part, each first terminal of the touch sensors and the voltage comparing part to switch a sensing signal passing the touch sensor into a first path in response to the third control signal; and
   a second switch connected to the charging/discharging circuit part, each second terminal of the touch sensors and the voltage comparing part to switch the sensing signal passing the touch sensor into a second path in response to the third control signal.

3. The capacitance measuring circuit of claim 2, when the third control signal has a first level, wherein the first switch connects to the charging/discharging circuit part and a first terminal of the touch sensor, and the second switch connects to a second terminal of the touch sensor and the voltage comparing part, and
   when the third control signal has a second level, wherein the second switch connects to the charging/discharging circuit part and a second terminal of the touch sensor, and the first switch connects to a first terminal of the touch sensor and the voltage comparing part.

4. The capacitance measuring circuit of claim 3, wherein the charging part comprises a first PMOS transistor and a second PMOS transistor, the first PMOS transistor having a source connected to a power voltage node, a gate and a drain commonly connected to each other; and the second PMOS transistor having a source connected to a power voltage node and a gate connected to the gate of the first PMOS transistor, and
   wherein the discharging part comprises a variable constant current source, a first NMOS transistor, a second NMOS transistor and a third NMOS transistor, the variable constant current source having a first terminal connected to a power voltage node; the first NMOS transistor having a source and a gate commonly connected to the variable constant current source, and a drain connected to a ground terminal; the second NMOS transistor having a source connected to the drain of the first PMOS transistor, a gate connected to the gate of the first NMOS transistor and a drain connected to a ground terminal; and the third NMOS transistor having a source connected to the charging switch, a gate connected to the gate of the first and second NMOS transistors and a drain connected to a ground terminal.

5. The capacitance measuring circuit of claim 4, when channel lengths of the first and second PMOS transistors are equal to channel lengths of the first and third NMOS transistors, respectively,
   wherein a channel width of the first PMOS transistor is equal to that of the second PMOS transistor,
   a channel width of the first NMOS transistor is equal to that of the second NMOS transistor, and
   a channel width of the third NMOS transistor is greater than that of the first NMOS transistor.

6. The capacitance measuring circuit of claim 1, wherein the charging/discharging circuit part comprises:
   a charging part outputting a charging current for charging the touch sensor;
   a discharging part outputting a discharging current for discharging the touch sensor; and
   a charging/discharging switch being turned-off in accordance with a charging/discharging control signal provided from an external device so that electric charges corresponding to the charging current are charged into the touch sensor, and being turned-on in accordance with the control signal to set an electric path between the touch sensor and the discharging part so that electric charges charged in the touch sensor are provided to the discharging part.

7. The capacitance measuring circuit of claim 6, wherein a discharging current by the charging/discharging switch is twice of a charging current by the charging/discharging switch.

8. The capacitance measuring circuit of claim 1, wherein the reference voltage generating part comprises:
   a first resistor having a first terminal connected to a power voltage terminal and a second terminal outputting the first reference voltage;
   a second resistor having a first terminal connected to the second terminal of the first resistor and a second terminal outputting the second reference voltage; and
   a third resistor having a first terminal connected to the second terminal of the second resistor and a second terminal connected to a ground terminal,
   wherein each of the first to third resistors is a variable resistor.

9. The capacitance measuring circuit of claim 1, wherein the voltage comparing part comprises:

a first voltage comparator comparing with the first reference voltage and a feedback voltage provided from the charging/discharging circuit part; and a second voltage comparator comparing with the second reference voltage and a feedback voltage provided from the charging/discharging circuit part, wherein each of the first and second voltage comparators has hysteresis characteristics.

10. The capacitance measuring circuit of claim 1, wherein a predetermined voltage is inforcely applied to a touch sensor not selected by the mux part.

11. The capacitance measuring circuit of claim 10, wherein the predetermined voltage is a voltage of a ground level.

12. The capacitance measuring circuit of claim 1, wherein the charging/discharging part comprises:
   a charging/discharging switch being on/off in accordance with a charging/discharging control signal provided from an external device;
   a first current mirror providing a first bias current corresponding to a power voltage;
   a second current mirror being mirrored to the first bias current to provide a second bias current;
   a discharging control part outputting a discharging control signal based on the second bias current;
   a discharging part being connected to a touch sensor to discharge electric charges of the touch sensor in response to the discharging control signal;
   a third current mirror mirroring a current corresponding to the first bias current when the charging/discharging switch is off;
   a charging control part outputting a charging control signal by mirroring of the third current mirror; and
   a charging part connected to the touch sensor to charge electric charges to the touch sensor in response to the charging control signal.

13. The capacitance measuring circuit of claim 12, wherein the first and second current mirrors, the charging control part and the charging part are configured by PMOS transistors, and the charging/discharging switch, the third current mirror, the discharging control part and the discharging part are configured by NMOS transistors.

14. The capacitance measuring circuit of claim 12, wherein the discharging part comprises two NMOS transistors serially connected to each other, wherein the charging part comprises two PMOS transistors serially connected to each other and two PMOS transistors parallelly connected to the two PMOS transistors.

15. A capacitive touch panel, comprising:
a plurality of touch sensors; and
a capacitance measuring circuit connected to two terminals of the touch sensors to sense a touch position by sensing a capacitance variation of the touch sensor, the capacitance measuring circuit comprising:
   a voltage comparing part outputting a first comparing signal by comparing with a first reference voltage and a sensing voltage of a touch sensor and a second comparing signal by comparing with a second reference voltage and the sensing voltage, in response to a first control signal provided from an external device;
   a control part outputting a charging/discharging control signal based on the first and second comparing signals, in response to a second control signal provided from an external device;
   a complex switch connected to each two terminals of the touch sensors, and configured to set a path transmitting a sensing signal to the touch sensor and a path receiving a sensing signal sensing a capacitance variation amount of the touch sensor via the touch sensor, in response to a third control signal provided from an external device;
   a charging/discharging circuit part charging a touch sensor selected by the complex switch from the first reference voltage to the second reference voltage or discharging the touch sensor selected by the complex switch from the second reference voltage to the first reference voltage, in response to the charging/discharging control signal; and
   a timer part receiving a third control signal and a fourth control signal provided from an external device, respectively measuring charging time and discharging time of the charging/discharging circuit part, respectively measuring entire charging time and entire discharging time, and outputting a corresponding output signal.

16. The capacitive touch panel of claim 15, wherein the capacitance measuring circuit and the touch sensor are connected to each other in a one-to-plural relationship.

* * * * *